US011495619B2

(12) United States Patent
Chang et al.

(10) Patent No.: US 11,495,619 B2
(45) Date of Patent: Nov. 8, 2022

(54) INTEGRATED CIRCUIT DEVICE WITH IMPROVED LAYOUT

(71) Applicant: Taiwan Semiconductor Manufacturing Co., Ltd., Hsin-Chu (TW)

(72) Inventors: Fong-yuan Chang, Hsin-Chu (TW); Chun-Chen Chen, Hsin-Chu (TW); Po-Hsiang Huang, Tainan (TW); Lee-Chung Lu, Taipei (TW); Chung-Te Lin, Tainan (TW); Jerry Chang Jui Kao, Taipei (TW); Sheng-Hsiung Chen, Zhubei (TW); Chin-Chou Liu, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 63 days.

(21) Appl. No.: 17/103,532

(22) Filed: Nov. 24, 2020

(65) Prior Publication Data
US 2021/0082960 A1 Mar. 18, 2021

Related U.S. Application Data

(62) Division of application No. 16/045,058, filed on Jul. 25, 2018, now Pat. No. 10,903,239.
(Continued)

(51) Int. Cl.
*H01L 27/118* (2006.01)
*G06F 30/398* (2020.01)
*H01L 27/02* (2006.01)

(52) U.S. Cl.
CPC ...... *H01L 27/11807* (2013.01); *G06F 30/398* (2020.01); *H01L 27/0207* (2013.01);
(Continued)

(58) Field of Classification Search
CPC combination set(s) only.
See application file for complete search history.

(56) References Cited

U.S. PATENT DOCUMENTS 9,633,987 B2 * 4/2017 Smayling .............. G06F 30/392
2013/0207199 A1 8/2013 Becker et al.
(Continued)

FOREIGN PATENT DOCUMENTS

KR 1020160034338 A 3/2016
KR 1020170015835 A 2/2017
(Continued)

OTHER PUBLICATIONS

Official Action dated Apr. 24, 2019, in corresponding Taiwan Patent Application No. 10820382600.

*Primary Examiner* — Mark W Tornow
*Assistant Examiner* — Priya M Rampersaud
(74) *Attorney, Agent, or Firm* — Duane Morris LLP

(57) ABSTRACT

An integrated circuit device includes a device layer having devices spaced in accordance with a predetermined device pitch, a first metal interconnection layer disposed above the device layer and coupled to the device layer, and a second metal interconnection layer disposed above the first metal interconnection layer and coupled to the first metal interconnection layer through a first via layer. The second metal interconnection layer has metal lines spaced in accordance with a predetermined metal line pitch, and a ratio of the predetermined metal line pitch to predetermined device pitch is less than 1.

20 Claims, 7 Drawing Sheets

Related U.S. Application Data

(60) Provisional application No. 62/538,312, filed on Jul. 28, 2017.

(52) U.S. Cl.
CPC ............... *H01L 2027/11862* (2013.01); *H01L 2027/11866* (2013.01); *H01L 2027/11875* (2013.01); *H01L 2027/11881* (2013.01); *H01L 2027/11885* (2013.01)

(56) References Cited

U.S. PATENT DOCUMENTS

| | | | |
|---|---|---|---|
| 2014/0175565 A1* | 6/2014 | Smayling | G03F 1/70 |
| | | | 257/401 |
| 2015/0028495 A1 | 1/2015 | Chen et al. | |
| 2017/0110405 A1* | 4/2017 | Peng | H01L 21/76816 |
| 2018/0175060 A1* | 6/2018 | Zhu | H01L 23/50 |
| 2018/0254287 A1* | 9/2018 | Seo | H01L 23/528 |

FOREIGN PATENT DOCUMENTS

| | | |
|---|---|---|
| KR | 1020170046087 A | 4/2017 |
| TW | 201719812 A | 6/2017 |

* cited by examiner

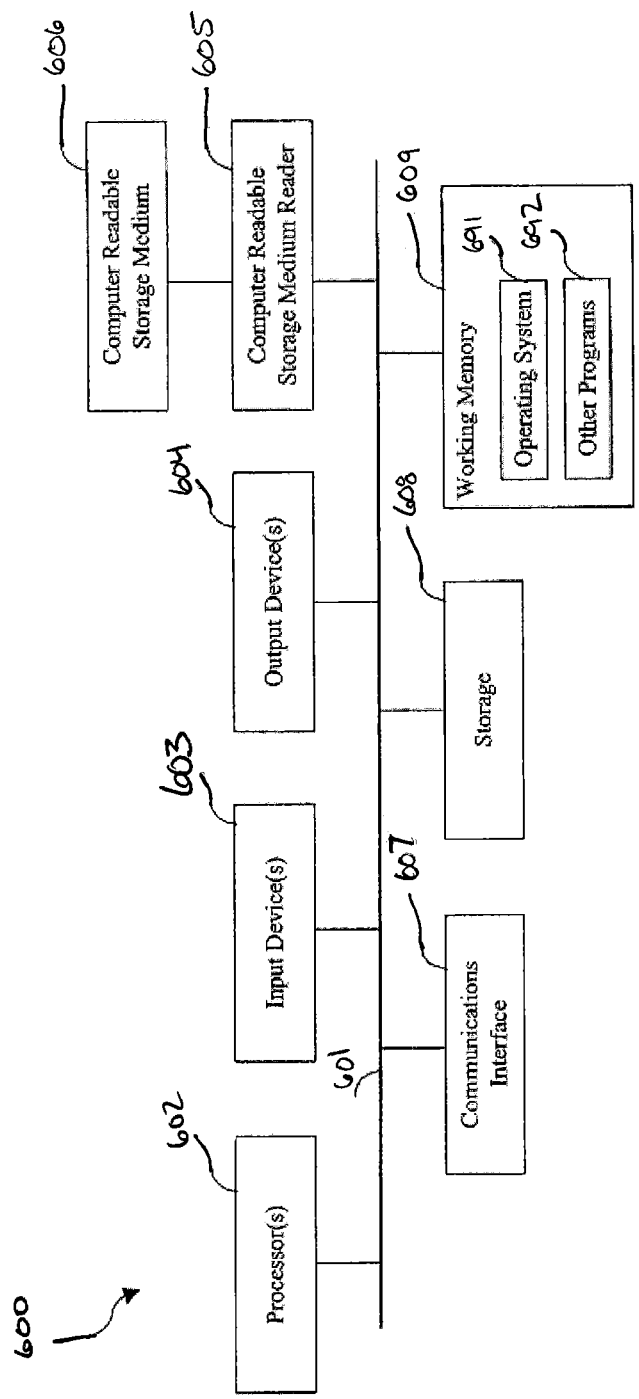

INTEGRATED CIRCUIT DEVICE WITH IMPROVED LAYOUT

CROSS-REFERENCE TO RELATED APPLICATION

The present application is a divisional application of U.S. patent application Ser. No. 16/045,058 to Chang et al., filed Jul. 25, 2018, which claims priority to U.S. Provisional Patent Application No. 62/538,312, filed on Jul. 28, 2017, each of which is incorporated by reference herein in its entirety.

BACKGROUND

In advanced integrated circuit nodes, the shape of connection pins to transistor and other active devices, such as input/output (I/O) connection pins, is limited to a rectangular shape. Polysilicon lines and connections pins also need to be located on predefined tracks. The typical approach is to locate all connection pins on the metal-I (M1) interconnection layer and set the pitch of the M1 tracks to match the pitch of the polysilicon lines at the device layer. That is, there is a one-to-one (1:1) ratio of M1 track pitch to polysilicon line pitch. This approach enlarges the M1 pitch, i.e., to match the pitch of the polysilicon lines, and also reduces the amount of routing resources available in the M1 interconnection layer. This approach also limits the ability to locate device cells directly under power lines that are formed in the M1 interconnection layer, as both the power lines and all connections pins are located in the M1 layer.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

FIG. 9 is a block diagram illustrating a computer system, in accordance with some embodiments.

DETAILED DESCRIPTION OF EXEMPLARY EMBODIMENTS

Figure 1:
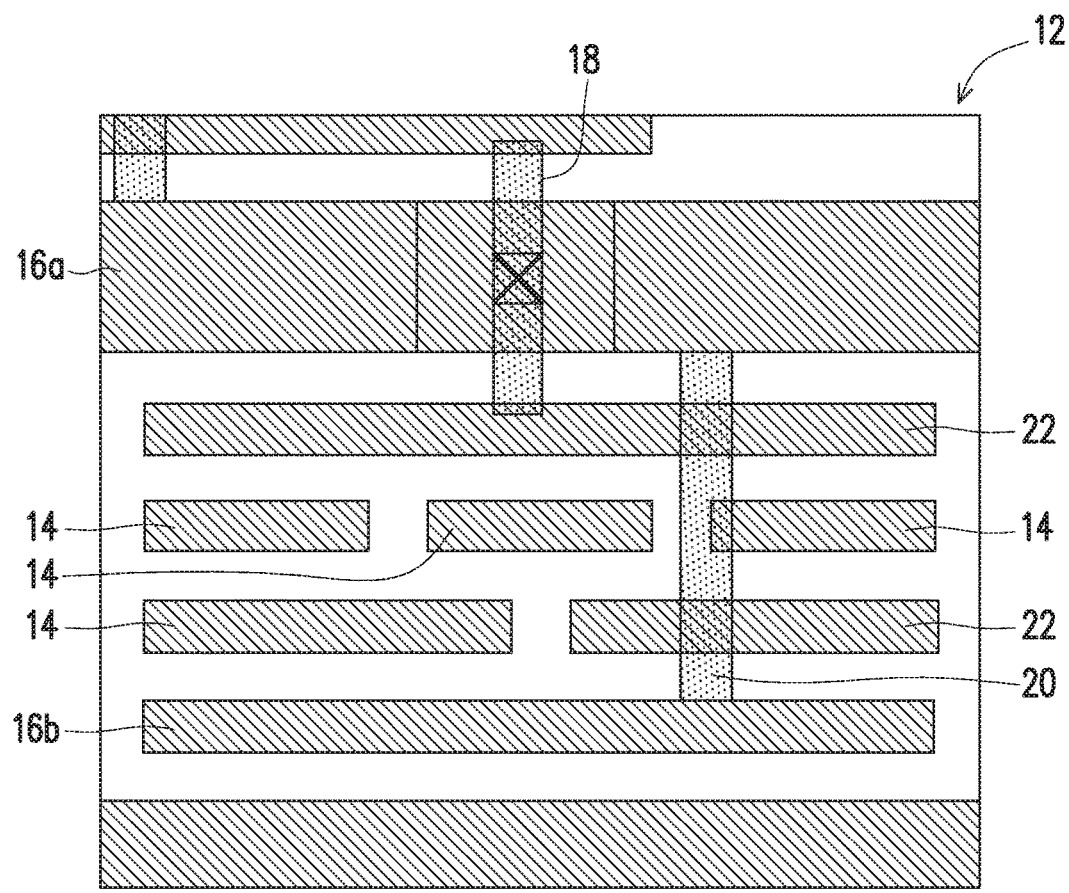
FIG. 1 illustrates a layout view of the M1 and M0 layers of device cell for an integrated circuit device, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of an integrated circuit structure and methods of making and designing the same. In embodiments, the integrated circuit structure design increases M1 routing resources and maximizes the connection pin access points. In certain embodiments when using the improved design, multiple device cell layouts are utilized in the design process to ensure that M1 line connection pins fall on M1 line tracks when the device cell is located at a cell site.

In certain embodiments, the ratio of the M1 pitch to polysilicon line pitch is reduced to be less than a 1:1 ratio. In embodiments, the M1 pitch to polysilicon line pitch is 2:3, 3:5, 1:2 or some other ratio X:Y where X is an integer less than an integer Y. In certain embodiments, the ratio is selected and then the VIA0 enclosure is designed in accordance with the selected ratio, specifically in order to maximize the number of pin access points, such as the VIA0 pin enclosure. In certain embodiments, multiple cell libraries can be used to ensure that all M1 lines and polysilicon lines are on their respective tracks. In certain embodiments, the M0 layer is used for pin access, which consumes M0 routing resources and frees up M1 routing resources. This allows for cells to be easily placed under a M1 power strap.

FIG. 1 (FIG. 1) illustrates a layout view of the M1 and M0 layers of device cell for an integrated circuit device. FIG. 1 shows an individual cell 12. In cell 12, the routing resources extending from left to right are in the M0 layer and the routing resources extending from bottom to top are in the M1 layer. More specifically, connection pins of the cell are formed in the M0 layer. For example, connection pins may be input pins. Internal wires 16a and 16b are also formed in the M0 layer, one of which (wire 16a) is shown underlying a power strap line 18 formed in the M1 layer. Wire 16 is connected to the power strap 18 by a conductive via. In certain embodiments, M1 resources, such as M1 output pin 20, connect active devices, such as NMOS and PMOS transistors of a CMOS cell through M0 output pins 22. Collectively, the M0 output pins 22 and M1 output pin 20 may be considered and output pin.

Figure 2:
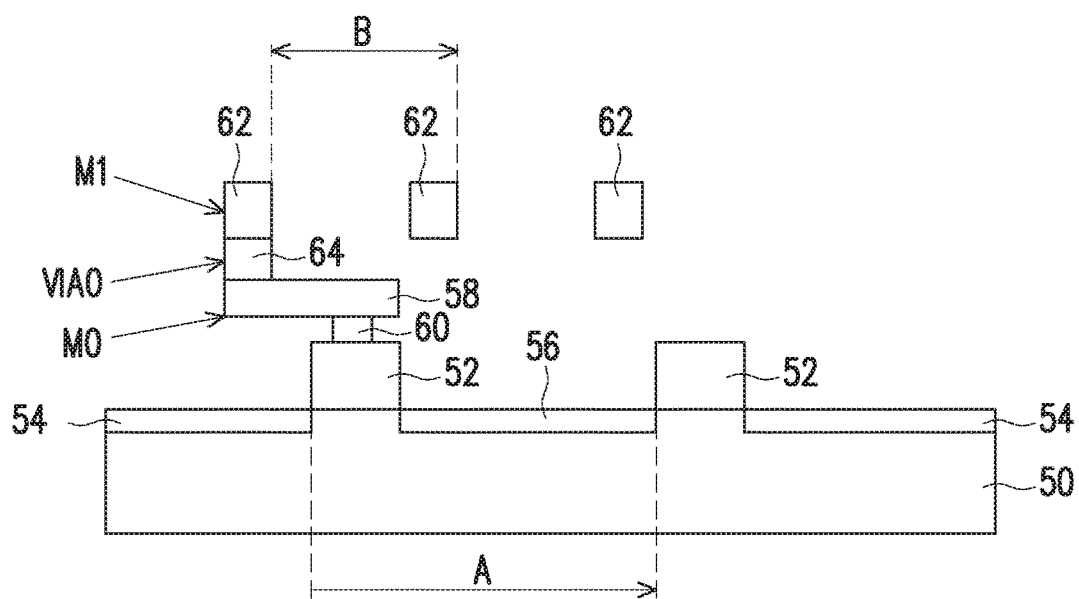
FIG. 2 is a cross-sectional view of a portion of a device cell where the M1 line pitch to polysilicon line pitch is set at a 2:3 ratio, in accordance with some embodiments.

FIG. 2 (FIG. 2) is a cross-sectional view of a portion of a cell and illustrates an embodiment where the M1 pitch to polysilicon pitch is a 2:3 ratio. A pair of transistor devices are formed on a substrate 50 as shown in FIG. 2. The transistor devices have polysilicon gates 52, drain regions 54 and source regions 56. The pitch of the polysilicon lines, which form gates 52, is labeled "A" in FIG. 2. At least one access pin 58 is formed in the M0 layer and connected to the polysilicon layer by a contact 60 (e.g., a Tungsten (W) contact) formed between the M0 layer and the polysilicon layer. It should be understood that in embodiments a cell will have additional pins formed in the M0 layer that are connected to underlying devices (e.g., the gates, source regions and drain regions) by respective conductive vias or contacts. M1 lines 62 are formed in the M1 layer and connected to the M0 pins by conductive vias 64 formed therebetween. This layer of vias 64 is referred to as the Via0 layer. The pitch of the M1 lines is labeled "B" in FIG. 2. As can be seen, the pitch of the M1 lines 62 is less than the pitch of the polysilicon lines 52. In the illustrated example, the M1 pitch is two-thirds of the polysilicon line pitch. The M0 layer is used for pin access. This arrangement—where the M0 layer is used for pin access and there is a smaller than one-to-one ratio of M1-to-polysilicon line pitch—increases the M1 routing resources when compared to a one-to-one M1 line pitch to polysilicon line pitch arrangement. It should be appreciated that pins, e.g., I/O pins, are defined for the circuit reflected in a cell. An input pin can connect to a polysilicon line through VIA0, and an output pin in the M1 layer can connect to a PMOS or NMOS device through M0 wires or be located in the M0 layer.

Figure 3:
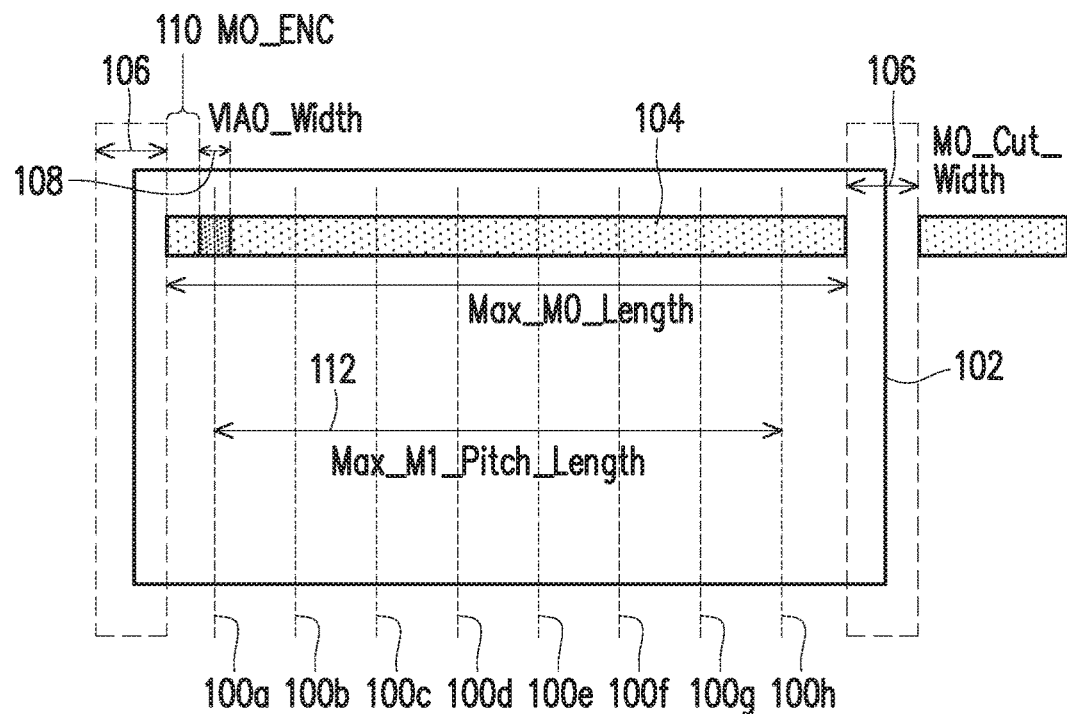
FIG. 3 illustrates features of a cell layout used in designing a VIA0 enclosure for pin access optimization, in accordance with some embodiments.

In embodiments, the VIA enclosure is designed to maximize the pin access points. In embodiments, the VIA0 enclosure is designed to maximize the pin access points. This concept is illustrated in FIG. 3 (FIG. 3). In FIG. 3, the M1 tracks are shown with dashed lines 100a to 100h. The cell boundary is shown at 102. A M0 line is shown at 104. In advanced node, the wire-end to wire-end spacing between two M0 wires is the M0_Cut_Width. During processing, a long wire is manufactured and then cut into two sub-wires. So, the M0_Cut_Width is the minimum spacing between two pins of the neighboring cells. The width of the cut of the M0 line at its ends is shown by reference 106 and labeled M0_Cut_Width in FIG. 3. The maximum possible length of a M0 line for a device cell is labeled Max_M0_Length and extends between two M0 cuts. A via connection 108 (VIA0) between a M1 line (not shown) on the M1 track 100a and the M0 line 104 is shown in FIG. 3. The width of any VIA0 that connects a M0 line and a M1 line is labeled as VIA0_Width. The M0 enclosure (M0_ENC), which is defined as the distance from the edge of a VIA0 108 that connects the M0 line and the endmost M1 line (either a M1 line on track 100a or track 100h) to the end of the M0 line, is labeled with reference 110. Put another way, the M0 enclosure is the distance from the outermost possible edge of a M0 line to the edge of the nearest possible VIA0 108. The maximum possible length of the M0 line (Max_M0_Length) can be defined by Equation 1 as follows, where X is the number of polysilicon line tracks per cell:

$$\text{Max\_M0\_Length} = X * \text{Poly\_Pitch} - \text{M0\_Cut\_Width}. \quad \text{(Eq. 1)}$$

It should be appreciated that X is the cell width divided by the polysilicon line pitch, meaning X*Poly_Pitch is the cell width. As such, the Max_M0 Length is the cell width minus the M0_Cut_Width. If we assume a M1 line pitch to polysilicon line pitch of 2:3, by way of example, then for the same cell area, there are five polysilicon line tracks for each eight M1 line tracks and X is equal to 5. As such, the maximum possible length of a M0 line for such a cell is five times the polysilicon line pitch minus M0_Cut_Width, for this example.

The maximum pitch between two M1 lines is shown in FIG. 3 with reference 112 and is labeled Max_M1_Pitch_Length. This value Max_M1_Pitch_Length is defined by Equation 2:

$$\text{Max\_M1\_Pitch\_Length} = \text{M1\_Pitch} * \text{int} \\ (\text{Max\_M0\_Length/M1\_Pitch}) - \\ \text{For\_M0\_Enclosure}) \quad \text{(Eq. 2)}$$

Variable For_M0_Enclosure is a small integer, such as 0, 1 or 2 that represents the number of M1 tracks not used. That is, For_M0_Enclosure equals 0 means all M1 track are used; For_M0_Enclosure equals 1 means 1 M1 track is not used; etc. And M1_Pitch is the center distance between two adjacent M1 rails (i.e., the distance between adjacent M1 tracks 100).

Variable For_M0_Enclosure is set to 0 to define a M0_ENC value where the number of access points is maximized. Using Equations 1 and 2, the value of M0_ENC is defined by Equation 3:

$$\text{M0\_Enc} \leq (\text{Max\_M0\_Length} - \\ \text{Max\_M1\_Pitch\_Length} - \text{VIA0\_Width})/2. \quad \text{(Eq. 3)}$$

As should be understood, a cell is a layout of a device. When a non 1:1 M1 line pitch to polysilicon line pitch is used for the cell, there can arise the need to have multiple cell layouts for a device to ensure that the M1 lines of the cell are placed on the M1 tracks. This is because the M1 line pitch is not the same as the polysilicon line pitch, and the cells can be placed at different cell sites on the design area. In a physical integrated circuit design, the design is divided by rows and a row is divided by sites. A site is a rectangle with height equal to the cell height. The cell width is usually equal to the polysilicon pitch. Cells are placed with a cell boundary aligned to the side edge. As a result, a cell's location can be shifted laterally with respect to the predefined M1 tracks, meaning if only one cell layout is used some cell's M1 line may not fall on a M1 track. Having more than one cell (i.e., more than one cell layout) for each device allows cells to be changed or selected during the design flow to ensure that the M1 pins are on the M1 tracks for each cell site. This concept is illustrated in FIGS. 4A and 4B (FIGS. 4A and 4B) discussed below.

Figure 4A:
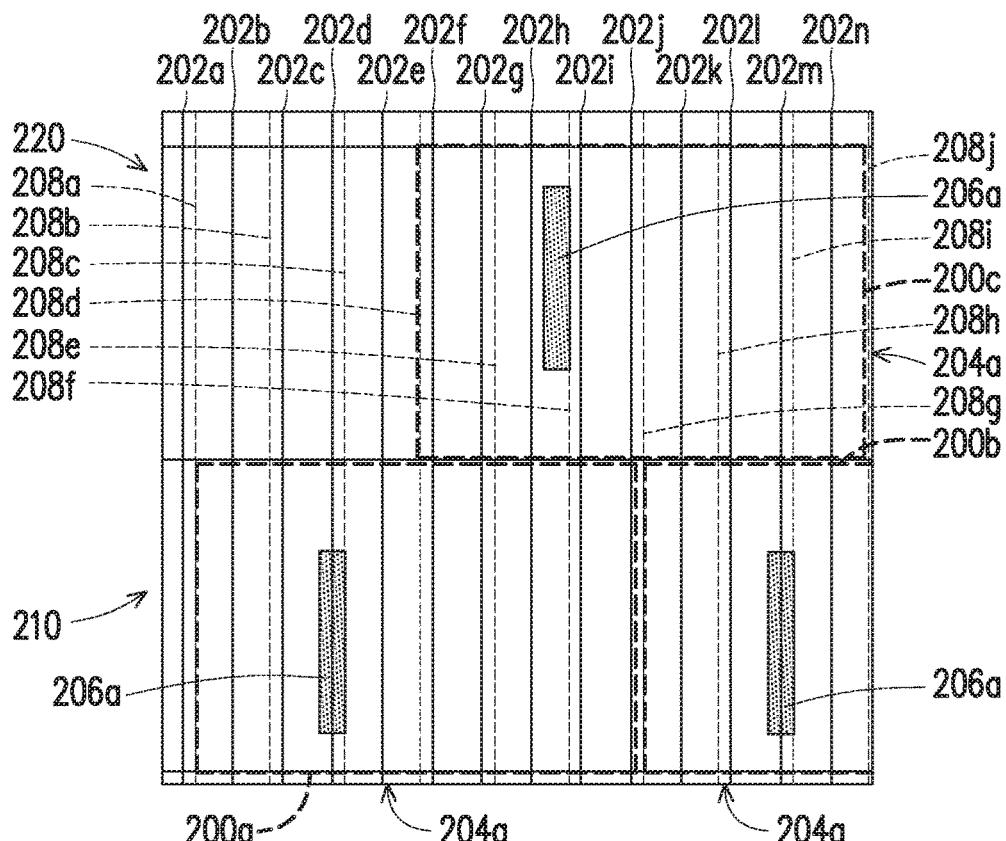
FIGS. 4A and 4B illustrate cells located at multiple cell sites in an integrated circuit design, in accordance with some embodiments.

FIG. 4A illustrates a partial view of a layout design for an integrated circuit having multiple rows of cell sites, with each row having multiple sites. Parts of two rows 210, 220 are shown in FIG. 4A. the edges of cells need to align to the cell sites. The cell sites are shown by the lines 208a to 208j. Row 210 includes a first cell 200a with its left edge aligned at cell site 208a and a second cell 200b (shown in partial) with its left edge aligned at cell site 208g. Row 220 includes a third cell 200c with its left edge aligned at cell site 208d. M1 line tracks 202a to 202n are shown extending across the illustrated layout area. FIG. 4A shows the same cell layout 204a being used for each of cells 200a, 200b, 200c. This cell layout 204a includes a M1 line 206a positioned with respect to the cell border. As can be seen in row 210, cells 200a, 200b are aligned with respect to the M1 line tracks such that the M1 lines 206a fall on M1 line tracks, specifically M1 line tracks 202d and 202m for cells 200a, 200b, respectively. However, when this same cell layout 204a is used in row 220, specifically for cell 200c, and the M1 line pitch to polysilicon line pitch is not 1:1, the M1 line 206a does not fall on a M1 line track, i.e., it falls between M1 lines tracks 202h and 202i, which violates a design rule. Specifically, it can be seen that the position of cell 200c with respect to the M1 line tracks 202 results in the M1 line 206a of cell layout 204a falling between, and not on, M1 line tracks, i.e., M1 line tracks 202h and 202i.

Figure 4B:
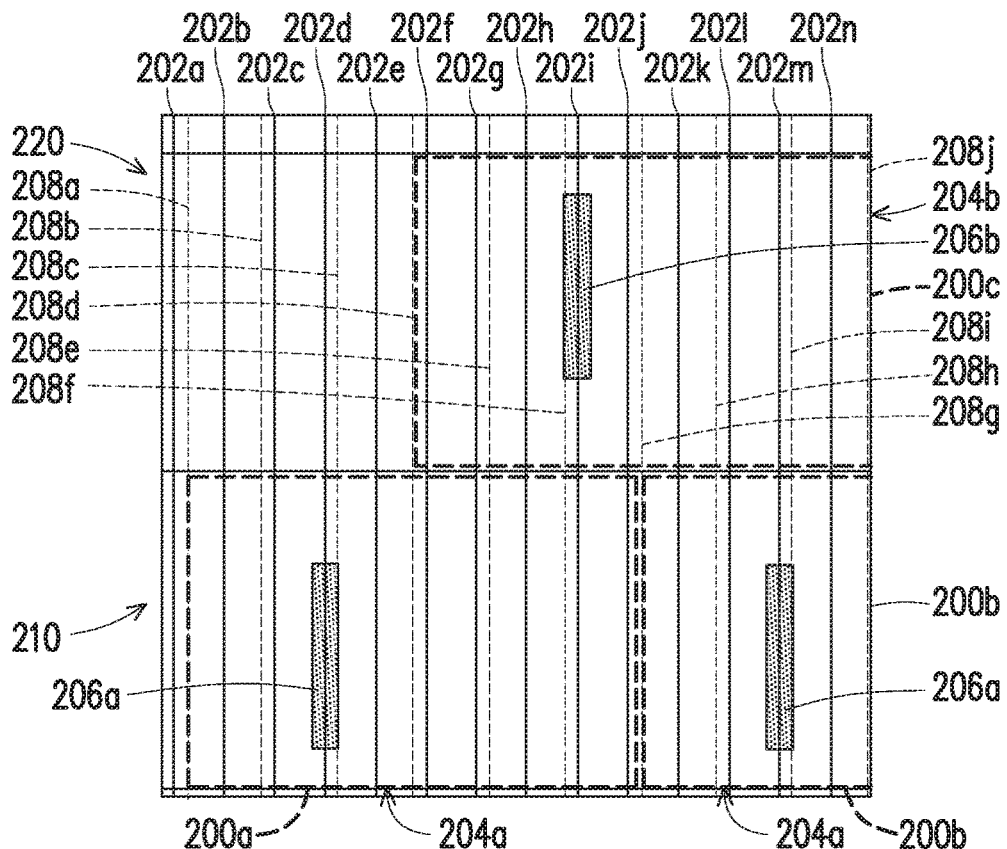

Turning to FIG. 4B, it can be seen that in row 220, a different cell layout 204b than cell layout 204a is used for cell 200c. When compared to the cell layout 204a, one difference is that the cell layout 204b has the M1 line 206b at a different location with respect to the cell edge (or any other common reference feature, e.g., a M0 line), such that the M1 line 206b now falls on a M1 line track, specifically on M1 line track 202i. In embodiments, M0 line location may also be different as between two cell layouts for the same device.

Assuming a M1 line pitch to polysilicon line pitch of X:Y, then the number of cell layouts needed is at least the least common multiple of X and Y divided by Y. For example, if the pitch ratio is 2:3, then the number of cell layouts needed is at least 2 (i.e., (2*3)/3). If the pitch ratio is instead 3:5, then the number of cell layouts needed is at least 3 (i.e., (3*5)/5). It should be understood that more cell layouts may be needed due to other rule constraints.

Multiple different cell layouts for a given device are developed by offsetting the center of the M1 wire in the different cell layouts by a set amount. The offset of any two layouts of a cell may be different. The minimum one of the M1 offsets of two layouts is referred to herein as the minimum offset. For example, the minimum offset is equal to the M1 pitch divided by the number of layouts needed. For example, if the ratio of M1 line pitch to polysilicon line pitch 2:3, then the offset between layouts is ½ *M1 pitch, since the 2:3 ratio dictates a maximum of two layout are needed. By way of another example, if the ratio of M1 line pitch to polysilicon line pitch is 3:5, then the offset between layouts is ⅓*M1 pitch, since the 3:5 ratio dictates a maximum of three layouts are needed.

Figure 5:
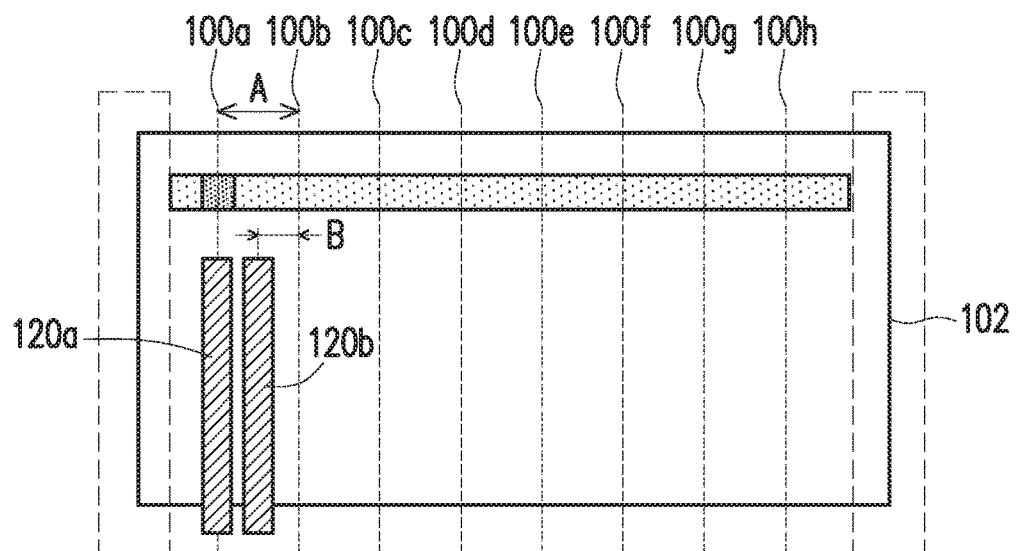
FIG. 5 illustrates alternative positions for a M1 line for different cell layouts of the same device cell, in accordance with some embodiments.

This concept is illustrated in FIG. 5 (FIG. 5), which uses the layout of FIG. 3 discussed above. As can be seen in FIG. 5, the pitch between M1 line tracks is shown as A. In a first layout, the M1 line 120a is located such that for a first cell site location the M1 line falls directly on the M1 line track 100a. However, for the 2:3 ratio discussed above, another cell site may be shifted laterally with respect to these M1 line tracks by an amount equal to ½*M1 pitch. As such, a second cell layout is needed that has a M1 line 120b that is shifted ½*M1 pitch laterally from the location in the first cell layout of the M1 line 120a. This second cell layout is used when the device cell is to be placed at a cell site location where use of the first cell layout (i.e., the layout having the M1 line 120a) would result in the M1 line missing the M1 line track. As such, at that cell site location, the second layout (i.e., the layout having M1 line 120b located as illustrated) is used. This methodology ensures that the M1 line falls on the center of the M1 line track.

Figure 6:
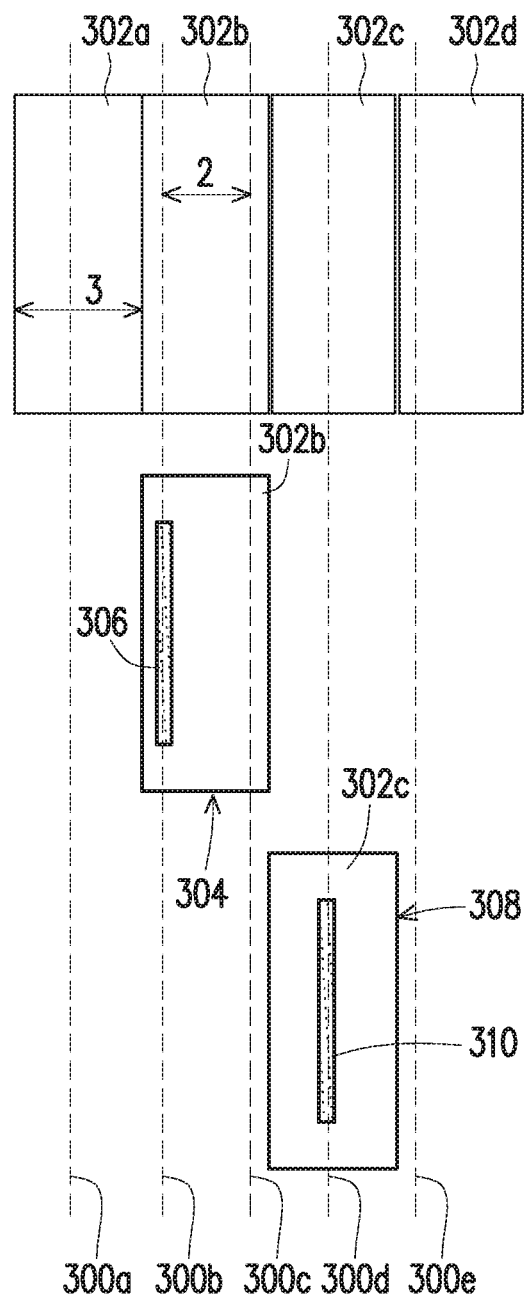
FIG. 6 illustrates the use of different cell layouts of the same device cell, in accordance with some embodiments.

This concept, i.e. where multiple cell layouts corresponding to a device cell are available for use when a non-1:1 M1 line to polysilicon line ratio is used, is further illustrated by FIG. 6 (FIG. 6). As shown in FIG. 6, an area of an integrated circuit design is traversed by predefined M1 line tracks 300a, 300b, 300c, 300d and 300e. The M1 line pitch to polysilicon line pitch is set at 2:3 for this example. FIG. 6 shows 4 possible sites 302a, 302b, 302c, 303d for polysilicon lines with respect to the M1 line tracks 300a, 300b, 300c, 300d and 300e. As can be seen from FIG. 6, the track positions with respect to the boundaries of the sites 302 repeat every 2 sites. That is, for sites 302a and 302c, the M1 line tracks 300 (i.e., 300a and 300d) fall in the center of the site 302 but for sites 302b and 302d, the M1 line tracks 300 (i.e., 300b, 300c and 300e) fall nearer to the lateral edges of the sites 302b and 302d. As shown in FIG. 6, when a cell is to be located at a first cell site location 302b, a first cell layout 304 is used that has a M1 line 306 aligned near a lateral edge of the cell layout 304 such that the M1 line 306 falls on a M1 line track 300 (here, M1 line track 302b). When a cell is to be located at a second cell site location 302c, a second cell layout 308 is used that has a M1 line 310 aligned at a center of the cell layout 308 such that the M1 line 310 falls on a M1 track 302 (here, the M1 track 302d). In summary, for a M1 line pitch to polysilicon line pitch of 2:3, a cell layout is provided with two different layouts for the M1 line alignment and, in embodiments, the cell layout M1 alignment is selected dependent on where the cell is to be placed with respect to the M1 line tracks.

Figure 7:
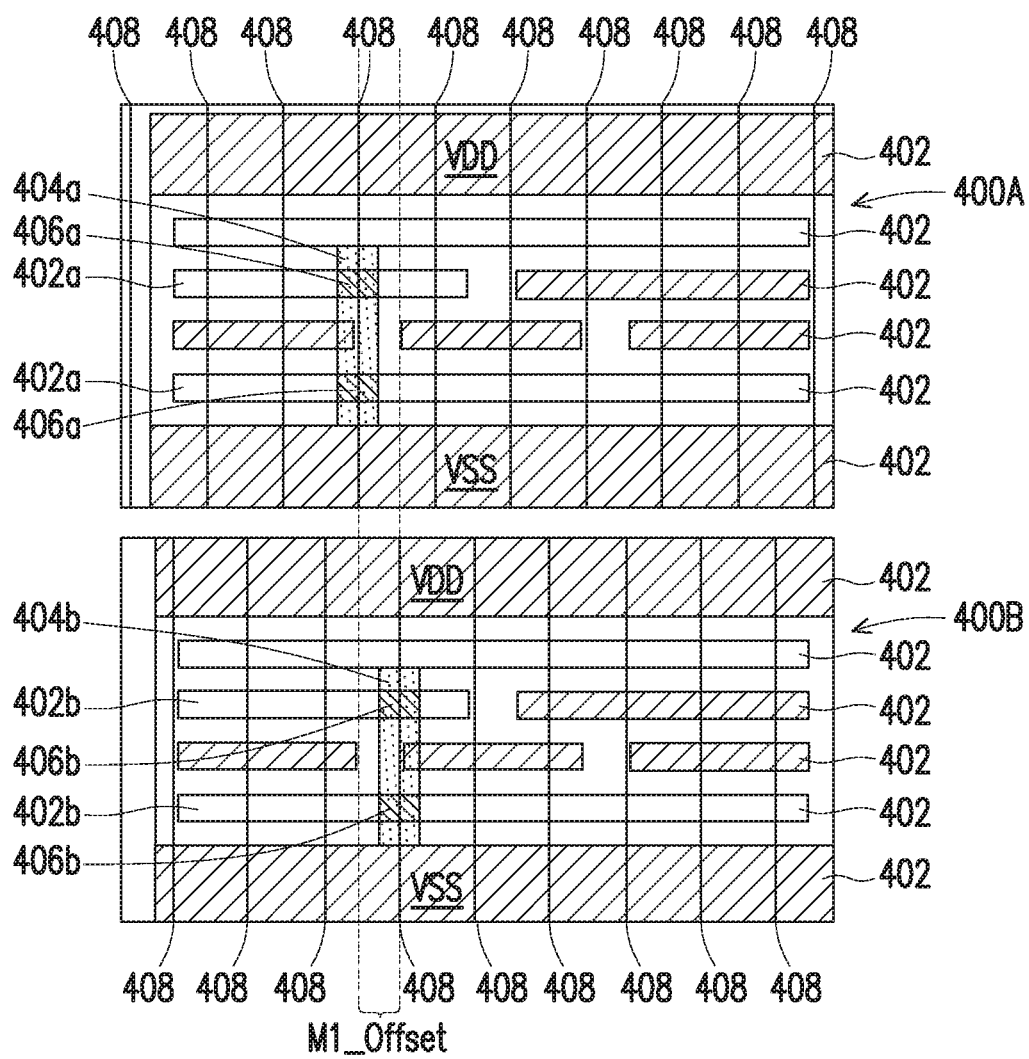
FIG. 7 illustrates the different positions of a M1 line in different cell layouts of the same device cell, in accordance with some embodiments.

FIG. 7 (FIG. 7) shows two different cell layouts 400A and 400B for comparison purposes. In embodiments, the cell layouts are identical at the M0 layer, which has M0 lines 402 extending from left to right. Pins in the M0 layer are illustrated without cross-hatch while internal wires in the M0 layer are illustrated with cross-hatch. The cells are aligned differently with respect their orientation to the M1 line tracks 408. As such, assuming a fixed reference in the device, such as the features in the M0 layer (e.g., a M0 pin) or device layer (e.g., polysilicon gate line), the position of the M1 line 404a in cell 400A is offset from the position of the M1 line 404b in cell 400B. This offset is identified as M1_Offset. The offset can be seen clearly by comparing the location of the vias 406a at the VIA0 layer in cell 400A to the location of the vias 406b at the VIA0 layer in the cell 400B. Specifically, the offset is reflected in where the vias 406a, 406b connect to the M0 lines 402, specifically to the M0 pins 402a, 402b, respectively, in cell layouts 400a, 400B.

Figure 8:
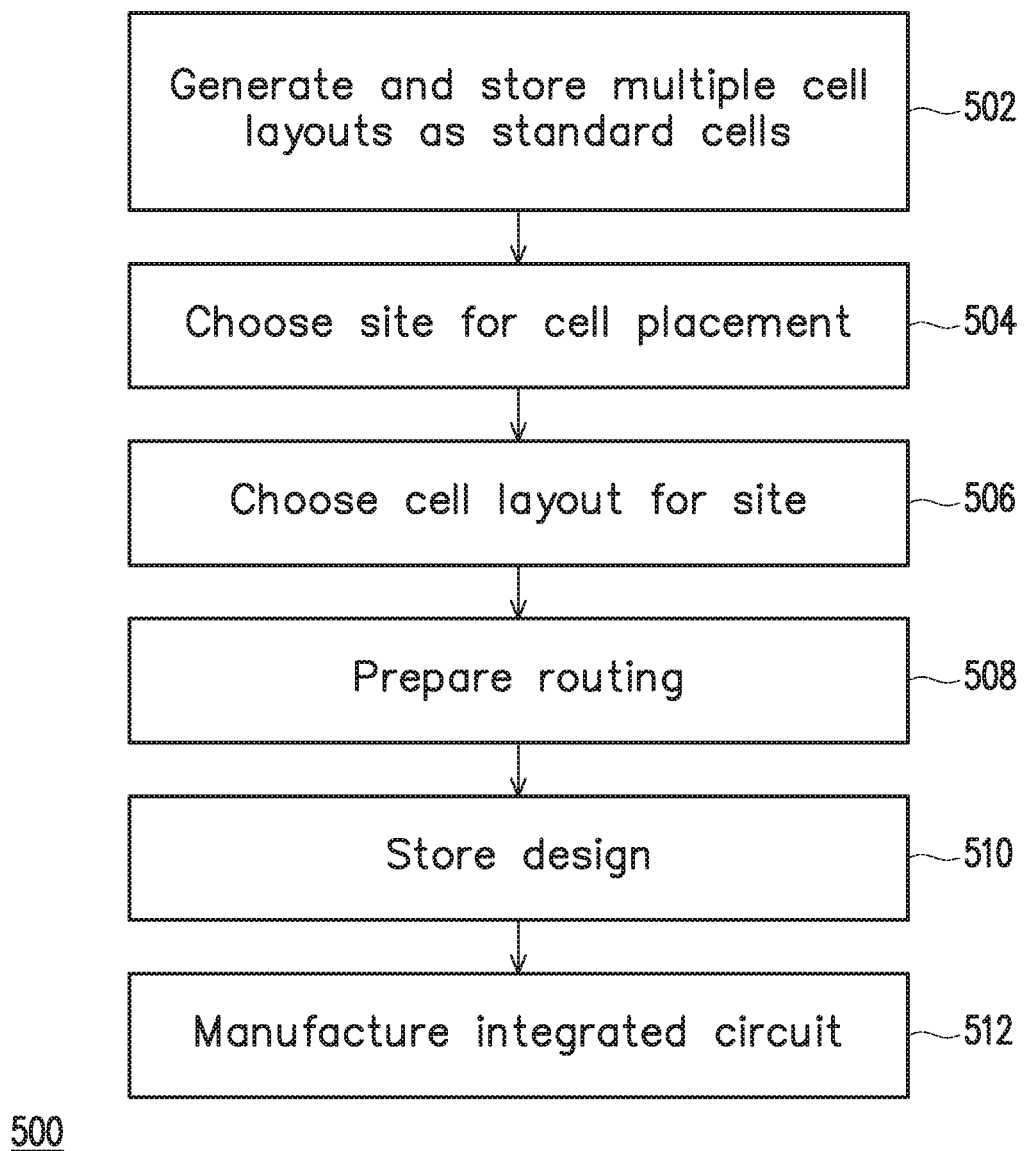
FIG. 8 is a flow diagram illustrating a method of manufacturing an integrated circuit device, in accordance with some embodiments.

FIG. 8 (FIG. 8) illustrates a method 500 of designing and manufacturing an integrated circuit in accordance with a generated integrated circuit design, according to certain embodiments, when the M1 line pitch is less than the pitch of the polysilicon lines. For example, in embodiments, the pitch ratio could be 2:3, 3:5 or 1:2 as discussed above. At step 502, multiple cell layouts for a device or devices are generated and stored as standard cells. That is, these cell layouts can correspond to basic devices, such as NAND devices, NOR devices, inverter devices or other basic devices, that can be used to make a larger, more complicated circuit. Multiple cell layouts for each device are stored in the cell library. For example, assuming the 2:3 pitch ratio embodiment, then for a given device two different cell layouts are stored with different M1 line locations offset from one another by ½*M1 pitch. In embodiments, other than the M1 line locations, which are offset from one another, and the Via0 connection to those M1 lines, the two cell layouts may be identical (i.e., at the device and M0 layers). In other embodiments, design requirements or limitations may dictate that the cell layouts also have differences in the M0 layer.

At step 504, a site (i.e., a rectangular area with the height equal to the cell height and the width equal to the polysilicon pitch) on a design area is selected for placement of the device cell. For example, with reference back to FIG. 4B, a site within row 210 or 220 for the device cell is selected.

At step 506, one of the plurality of the cell layouts for the device (that are generated and stored at step 504) is selected for that cell site that ensures that the M1 line(s) fall on M1 line track(s).

At step 508, the routing layout is prepared. That is, the layout of metal segments an vias for connecting multiple pins of cells is prepared. For example, the INNOVUS™ implementation system software tool from Cadence Design Systems, Inc. of San Jose, Calif. can be used on a PC, workstation or other processing environment to develop the routing layout. Indeed, in embodiments this software tool (or another) can be used in performance of steps 502 to 510 of FIG. 8.

At step 510, the design (cell layout and routing) is stored in LEF/DEF format, in certain embodiments, in a database or other data store. Layout Exchange Format (LEF) defines the elements of an IC process technology and associated library of cell models. Design Exchange Format (DEF) defines the elements of an IC design relevant to physical layout, including the netlist and design constraints. That is, LEF format may be used to represent cells, and DEF format may be used to represent placement and routing.

Finally, at step 512, this stored design (i.e., the design stored at step 510) is then used in an integrated circuit manufacturing process. For example, the stored design is sued to prepare the masks used in the manufacturing process. Those masks are then used in manufacturing on a wafer the various layers that form the integrated circuit.

In embodiments, the selection of a non 1:1 ratio of M1 track pitch to polysilicon line pitch, such as a 2:3 ratio, allows for use of a M0 pin that would otherwise be located on M1 and saves routing resources. For example, in embodiments a 2:3 ratio can save 40% of M0 metal resources and 50% of M1 metal resources for a 7 nm or 7 nm+ generation integrated circuit structure. In embodiments, the techniques described herein are applied in, but not limited to, a 7 nm (size) generation and lower generations, e.g., 5 nm and 3 nm. In embodiments, the generation is a 7 nm+ (N7+) generation, such as that of the present Applicant, which is a 7 nm generation with some layers processed with EUVL, which improve yields and reduces fab cycle times while delivering improved power consumption and between 15-20% area scaling over first generation 7 nm process. The 7 nm+ generation can have areas of reduced size for logic and routing, as compared to the 7 nm generation. As such, the techniques described herein can be of particular benefit in designing and manufacturing N7+ generation integrated circuits.

The teachings of the present disclosure can be embodied in the form of methods and apparatus for practicing those methods. These embodiments can also be embodied in the form of program code embodied in tangible media, such as secure digital ("SD") cards, USB flash drives, diskettes, CD-ROMs, DVD-ROMs, Blu-ray disks, hard drives, or any other non-transitory machine-readable storage medium, wherein, when the program code is loaded into and executed by a machine, such as a computer, the machine becomes an apparatus for practicing the teachings of the present disclosure. The teachings of the present disclosure can also be embodied in the form of program code, for example, whether stored in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the embodiment. When implemented on a general-purpose processor, the program code segments combine with the processor to provide a unique device that operates analogously to specific logic circuits.

FIG. 9 illustrates an exemplary computing system 600 for implementing embodiments disclosed herein. While other application-specific alternatives might be utilized, it should be understood that embodiments disclosed herein may be implemented in hardware, software or some combination by one or more processing systems consistent therewith, unless otherwise indicated.

Computer system 600 includes elements coupled via communication channels (e.g. bus 601) including one or more general or special purpose processors 602. System 600 elements also include one or more input devices 603 (such as a mouse, keyboard, microphone, pen, etc.), and one or more output devices 604, such as a suitable display, speakers, actuators, etc., in accordance with a particular application.

System 600 also includes a computer readable storage media reader 605 coupled to a computer readable storage medium 606, such as a storage/memory device or hard or removable storage/memory media; such devices or media are further indicated separately as storage device 608 and memory 609, which can include hard disk variants, floppy/compact disk variants, digital versatile disk ("DVD") variants, smart cards, read only memory, random access memory, cache memory, etc., in accordance with a particular application. One or more suitable communication devices 607 can also be included, such as a modem, DSL, infrared or other suitable transceiver, etc. for providing inter-device communication directly or via one or more suitable private or public networks that can include but are not limited to those already discussed.

Working memory further includes operating system ("OS") 691 elements and other programs 692, such as application programs, mobile code, data, etc. for implementing embodiment elements that might be stored or loaded therein during use. The particular OS can vary in accordance with a particular device, features or other aspects in accordance with a particular application (e.g. Windows, Mac, Linux, Unix or Palm OS variants, a proprietary OS, etc.). Various programming languages or other tools can also be utilized, such as C++, Java, Visual Basic, etc.

One or more system 600 elements can also be implemented in hardware, software or a suitable combination. When implemented in software (e.g. as an application program, object, downloadable, servlet, etc. in whole or part), a system 600 element can be communicated transitionally or more persistently from local or remote storage to memory (or cache memory, etc.) for execution, or another suitable mechanism can be utilized, and elements can be implemented in compiled or interpretive form. Input, intermediate or resulting data or functional elements can further reside more transitionally or more persistently in a storage media, cache or more persistent volatile or non-volatile memory, (e.g. storage device 607 or memory 608) in accordance with a particular application.

As described herein, in certain embodiments, an integrated circuit device layout is adopted where the M1 line pitch to polysilicon line pitch is not a 1:1 ratio, and specifically is in a ratio where the M1 line pitch is less than the polysilicon line pitch. In embodiments, this approach to the cell layout frees up M1 interconnection layer resources by moving connection pins to the M0 layer. This, in turn, advantageously allows for device cells to be placed directly under power straps in the M1 interconnection layer. In embodiments, manufacturing methods are adapted such that there are multiple cell layouts for a given device, which allows for the selection of a cell layout that ensures the M1 lines will fall on predefined M1 tracks when the non 1:1 ratio of M1 line pitch to polysilicon line pitch is adopted. In certain embodiments, the selection of a given cell layout can be integrated into the existing design and manufacturing process and automated.

In an embodiment, of an integrated circuit device, the integrated circuit device includes a device layer having devices spaced in accordance with a predetermined device pitch; a first metal interconnection layer disposed above the device layer and coupled to the device layer; a second metal interconnection layer disposed above the first metal interconnection layer and coupled to the first metal interconnection layer through a first via layer, wherein the second metal interconnection layer has metal lines spaced in accordance with a predetermined metal line pitch, and wherein a ratio of the predetermined metal line pitch to predetermined device pitch is less than 1. In an embodiment, the ratio is X:Y where X and Y are integer values. In an embodiment, X is 2 and Y is 3. In an embodiment, X is 3 and Y is 5. In an embodiment, the predetermined device pitch is a polysilicon line pitch. In an embodiment, the integrated circuit device includes a device corresponding to a cell, and the cell includes at least one cell connection pin in the first metal interconnection layer and at least one cell connection pin in the second metal interconnection layer. In an embodiment, the integrated circuit further includes a power strap formed in the second metal interconnection layer, wherein the cell is located under the power strap. In an embodiment, the cell conforms with the equation $M0\_Enc \leq (Max\_M0\_Length - Max\_M1\_Pitch\_Length - VIA0\_Width)/2$, where: Max_M0_Length represents a maximum possible length of a line in the first metal interconnection layer in the cell; Max_M1_Pitch_Length represents a maximum possible pitch between two lines in the second metal interconnection layer in the cell; VIA0_Width represents a width of a via that connects a line in the first metal interconnection layer with a line in the second metal interconnection layer; and M0_Enc represents a distance from an outermost edge of the line in the first metal interconnection layer to an edge of a nearest possible via connecting the line in the first metal interconnection layer to the line in the second metal interconnection layer. In an embodiment, the integrated circuit device includes first and second instances of a device, the first instance of the device corresponding with a first cell having a first cell layout and a second instance of the device corresponding with a second cell having a second cell layout, wherein the first and second cells have a same layout at the device layer and wherein the first and second device cells have corresponding metal lines in the second metal interconnection layer positioned differently with respect to a common identically located feature in the first and second cell layouts. In an embodiment, the integrated circuit device has predetermined track locations for metal lines in the second metal interconnection layer, and the corresponding metal lines of the first and second cells are positioned differently to each align with a track location from the predetermined track locations.

In another embodiment of an integrated circuit device, the integrated circuit device includes a first instance of a device fabricated at a first location in accordance with a first cell layout; and a second instance of the device fabricated at a second location in accordance with a second cell layout; wherein the cell layouts includes a device layer, a first metal interconnection layer disposed above the device layer and coupled to the device layer, and a second metal interconnection layer disposed above the first metal interconnection layer and coupled to the first metal interconnection layer through a first via layer, wherein a ratio in the cell layouts of a predefined metal line pitch in the second metal interconnection layer to a predefined polysilicon line pitch in the device layer is less than 1, and wherein the first and second cell layouts differ in a relative location of at least one metal line in the second metal interconnection layer with respect to a common feature in the cell layouts. In an embodiment, the locations of the at least one metal line in the second interconnection layer in the first and second cell layouts are laterally offset from one another with respect to the common feature in the cell layouts. In an embodiment, the cell layouts include at least one connection pin in the second metal interconnection layer and at least one connection pin in the first metal interconnection layer. In an embodiment, the cell layouts conform with the equation $M0\_Enc \leq (Max\_M0\_Length - Max\_M1\_Pitch\_Length - VIA0\_Width)/2$, where: Max_M0_Length represents a maximum possible length of a line in the first metal interconnection layer in the cell layouts; Max_M1_Pitch_Length represents a maximum possible pitch between two lines in the second metal interconnection layer in the cell layouts; VIA0_Width represents a width of a via that connects a line in the first metal interconnection layer with a line in the second metal interconnection layer; and M0_Enc represents a distance from an outermost edge of the line in the first metal interconnection layer to an edge of a nearest possible via connecting the line in the first metal interconnection layer to the line in the second metal interconnection layer.

In an embodiment of a method of manufacturing an integrated circuit device, the method includes selecting, from a plurality of cells for a device where the cells having different cell layouts, a first site in an integrated circuit design; selecting one of the cells for the device for the first site; preparing a routing layout after selecting the one of the cells; storing the routing layout; and manufacturing the integrated circuit device using the stored layout, wherein each cell includes a device layer, a first metal interconnection layer disposed above the device layer and coupled to the device layer, and a second metal interconnection layer disposed above the first metal interconnection layer and coupled to the first metal interconnection layer through a first via layer, and a ratio in the cell of a predefined metal line pitch in the second metal interconnection layer to a predefined polysilicon line pitch in the device layer is less than 1. In an embodiment, the method further includes the step of selecting a different one of the cells for a second site different than the first site. In an embodiment, the ratio is X:Y where X and Y are integer values. In an embodiment, the plurality of cells for the device includes first and second cells, wherein the first and second cells differ in relative location of at least one metal line in the second metal interconnection layer with respect to a common feature in the cells. In an embodiment, the locations of the at least one metal line in the second interconnection layer in the cells are laterally offset from one another with respect to the common feature in the cells. In an embodiment, each cell conforms with the equation $M0\_Enc \leq (Max\_M0\_Length - Max\_M1\_Pitch\_Length - VIA0\_Width)/2$, where: Max_M0_Length represents a maximum possible length of a line in the first metal interconnection layer in the cell; Max_M1_Pitch_Length represents a maximum possible pitch between two lines in the second metal interconnection layer in the cell; VIA0_Width represents a width of a via that connects a line in the first metal interconnection layer with a line in the second metal interconnection layer; and M0_Enc represents a distance from an outermost edge of the line in the first metal interconnection layer to an edge of a nearest possible via connecting the line in the first metal interconnection layer to the line in the second metal interconnection layer.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device, comprising:
a device layer having devices spaced in accordance with a predetermined device pitch;
a first metal interconnection layer disposed above the device layer and coupled to the device layer; and
a second metal interconnection layer disposed above the first metal interconnection layer and coupled to the first metal interconnection layer through a first via layer,
wherein the second metal interconnection layer has metal lines spaced in accordance with a predetermined metal line pitch, and
wherein a ratio of the predetermined metal line pitch to predetermined device pitch is less than 1,
wherein the integrated circuit device comprises a device corresponding to a cell, and the cell includes at least one cell connection pin in the first metal interconnection layer and at least one cell connection pin in the second metal interconnection layer, and
wherein the cell conforms with the equation $M0\_Enc \leq (Max\_M0\_Length - Max\_M1\_Pitch\_Length - VIA0\_Width)/2$, where:
Max_M0_Length represents a maximum possible length of a line in the first metal interconnection layer in the cell;
Max_M1_Pitch_Length represents a maximum possible pitch between two lines in the second metal interconnection layer in the cell;
VIA0_Width represents a width of a via that connects a line in the first metal interconnection layer with a line in the second metal interconnection layer; and
M0_Enc represents a distance from an outermost edge of the line in the first metal interconnection layer to an edge of a nearest possible via connecting the line in the first metal interconnection layer to the line in the second metal interconnection layer.

2. The integrated circuit device of claim 1, wherein the ratio is X:Y where X and Y are integer values.

3. The integrated circuit device of claim 2, wherein X is 2 and Y is 3.

4. The integrated circuit device of claim 2, wherein X is 3 and Y is 5.

5. The integrated circuit device of claim 1, wherein the predetermined device pitch is a polysilicon line pitch.

6. The integrated circuit device of claim 1, further comprising a power strap formed in the second metal interconnection layer, wherein the cell is located under the power strap.

7. The integrated circuit device of claim 1, wherein the integrated circuit device includes first and second instances of a device, the first instance of the device corresponding with a first cell having a first cell layout and a second instance of the device corresponding with a second cell having a second cell layout, wherein the first and second cells have a same layout at the device layer and wherein the first and second device cells have corresponding metal lines in the second metal interconnection layer positioned differently with respect to a common identically located feature in the first and second cell layouts.

8. The integrated circuit device of the claim 7,
wherein the integrated circuit device has predetermined track locations for metal lines in the second metal interconnection layer, and
wherein the corresponding metal lines of the first and second cells are positioned differently to each align with a track location from the predetermined track locations.

9. The integrated circuit device of claim 1, wherein the at least one cell connection pin in the first metal interconnection layer includes at least one input/output (I/O) cell connection pin and the at least one cell connection pin in the second metal interconnection layer includes at least one input/output (I/O) cell connection pin.

10. An integrated circuit device, comprising:
a first instance of a device fabricated at a first location in accordance with a first cell layout; and
a second instance of the device fabricated at a second location in accordance with a second cell layout;
wherein the cell layouts includes a device layer, a first metal interconnection layer disposed above the device layer and coupled to the device layer, and a second metal interconnection layer disposed above the first metal interconnection layer and coupled to the first metal interconnection layer through a first via layer,
wherein a ratio in the cell layouts of a predefined metal line pitch in the second metal interconnection layer to a predefined polysilicon line pitch in the device layer is less than 1, and
wherein the first and second cell layouts differ in a relative location of at least one metal line in the second metal interconnection layer with respect to a common feature in the cell layouts,
wherein the cell layouts conform with the equation $M0\_Enc \leq (Max\_M0\_Length - Max\_M1\_Pitch\_Length - VIA0\_Width)/2$, where:
Max_M0_Length represents a maximum possible length of a line in the first metal interconnection layer in the cell layouts;
Max_M1_Pitch_Length represents a maximum possible pitch between two lines in the second metal interconnection layer in the cell layouts;
VIA0_Width represents a width of a via that connects a line in the first metal interconnection layer with a line in the second metal interconnection layer; and
M0_Enc represents a distance from an outermost edge of the line in the first metal interconnection layer to an edge of a nearest possible via connecting the line in the first metal interconnection layer to the line in the second metal interconnection layer.

11. The integrated circuit device of claim 10, wherein the locations of the at least one metal line in the second interconnection layer in the first and second cell layouts are laterally offset from one another with respect to the common feature in the cell layouts.

12. The integrated circuit device of claim 10, wherein the cell layouts include at least one connection pin in the second metal interconnection layer and at least one connection pin in the first metal interconnection layer.

13. The integrated circuit device of claim 10, wherein each cell layout includes at least one cell connection pin in the first metal interconnection layer and at least one cell connection pin in the second metal interconnection layer.

14. An integrated circuit device, comprising:
a device layer having device features spaced in accordance with a predetermined pitch;
a first interconnection layer disposed above the device layer and coupled to the device layer; and
a second interconnection layer disposed above the first interconnection layer and coupled to the first interconnection layer through a first via layer,
wherein the second interconnection layer has connection lines spaced in accordance with a predetermined line pitch, and
wherein a ratio of the predetermined line pitch to predetermined device pitch is less than 1,
wherein the integrated circuit device comprises a device corresponding to a cell, and the cell includes at least one cell connection pin in the first metal interconnection layer and at least one cell connection pin in the second metal interconnection layer, and
wherein the cell conforms with the equation $M0\_Enc \leq (Max\_M0\_Length - Max\_M1\_Pitch\_Length - VIA0\_Width)/2$, where:
Max_M0_Length represents a maximum possible length of a line in the first interconnection layer in the cell;
Max_M1_Pitch_Length represents a maximum possible pitch between two lines in the second interconnection layer in the cell;
VIA0_Width represents a width of a via that connects a line in the first interconnection layer with a line in the second interconnection layer; and
M0_Enc represents a distance from an outermost edge of the line in the first interconnection layer to an edge of a nearest possible via connecting the line in the first interconnection layer to the line in the second interconnection layer.

15. The integrated circuit of claim 14, wherein the predetermine pitch is a polysilicon line pitch.

16. The integrated circuit of claim 14, wherein the device features are gates.

17. The integrated circuit device of claim 14, further comprising a power strap formed in the second interconnection layer, wherein the cell is located under the power strap.

18. The integrated circuit device of claim 14, wherein the integrated circuit device includes first and second instances of a device, the first instance of the device corresponding with a first cell having a first cell layout and a second instance of the device corresponding with a second cell having a second cell layout, wherein the first and second cells have a same layout at the device layer and wherein the first and second device cells have corresponding interconnection lines in the second interconnection layer positioned differently with respect to a common identically located feature in the first and second cell layouts.

19. The integrated circuit device of claim 14, wherein the at least one cell connection pin in the first metal interconnection layer includes at least one input/output (I/O) cell connection pin and the at least one cell connection pin in the second metal interconnection layer includes at least one input/output (I/O) cell connection pin.

20. The integrated circuit device of claim 19, wherein the I/O cell connection pins are cell connection pins for a CMOS cell.

* * * * *